US006329938B1

(12) United States Patent
Spaur et al.

(10) Patent No.: US 6,329,938 B1
(45) Date of Patent: Dec. 11, 2001

(54) PROGRAMMABLE ANALOG-TO-DIGITAL CONVERTER WITH BIT CONVERSION OPTIMIZATION

(75) Inventors: Michael R. Spaur, Irvine; Francis M. Caster, II, Lake Forest, both of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/595,437

(22) Filed: Jun. 15, 2000

(51) Int. Cl.[7] .............................. H03M 1/06; H03M 1/34
(52) U.S. Cl. ............................................. 341/118; 341/165
(58) Field of Search ..................................... 341/110, 120, 341/156, 134, 118, 142, 157, 155, 164, 165

(56) References Cited

U.S. PATENT DOCUMENTS 4,851,838 * 7/1989 Shier ...................................... 341/121
5,870,052 * 2/1999 Dedic et al. .......................... 341/161
6,028,545 * 2/2000 Chen ...................................... 341/156

OTHER PUBLICATIONS

Anonymous, "2.7 V to 5.5 V, 4.5 μs, 8–Bit ADC in 8–Lead microSOIC/DIP", Analog Devices, AD7823, ©Analog Devices, Inc., 1998.
Grebene, "Bipolar and MOS Analog Integrated Circuit Design", pp. 825–879, ©1984, John Wiley & Sons, Inc., Canada.

* cited by examiner

Primary Examiner—Patrick Wamsley
(74) Attorney, Agent, or Firm—Martine & Penilla, LLP

(57) ABSTRACT

The present invention provides a programmable ADC with bit conversion optimization and method therefor. The programmable ADC includes an amplifier, a programmable clock generator, a comparator, a successive approximation logic, a digital-to-analog converter, and a voltage converter. The amplifier is arranged to sample and hold an input analog signal to be converted into N digital data bits. The programmable clock generator generates a clock signal for each of the N-bits to trigger setting of one of the N-bit digital data bits such that each of the N bits is set during a time optimized for each bit. The comparator is coupled to receive and compare the input analog signal with a successively approximated analog signal to generate a digital output signal. The successive approximation logic is configured to successively set each of the N-bits in response to the digital output signal and the clock signal to generate a successively approximated N-bit digital data. The digital-to-analog converter converts the successively approximated N-bit digital data into a successively approximated analog current signal. The voltage converter has a resistance value for converting the successively approximated analog current signals into the successively approximated analog signal for input to the comparator. The voltage converter is arranged to optimize a time constant defined by the resistance and an output capacitance of the digital-to-analog converter.

22 Claims, 5 Drawing Sheets

PROGRAMMABLE ANALOG-TO-DIGITAL CONVERTER WITH BIT CONVERSION OPTIMIZATION

BACKGROUND OF THE INVENTION

1. Field of the Invention

This invention relates generally to rotating magnetic storage devices, and more particularly to analog to digital conversion of signals related to those storage devices.

2. Description of the Related Art

Analog-to-digital converters (ADC) are widely used in digital devices to interface between the analog and digital world. An ADC converts an analog signal such as a voltage or a current into a digital signal that can be further processed, stored, and decimated using digital computers. For example, ADCs are used in communications, appliances, signal processing, computers, and any other fields that require conversion of analog signals into digital forms.

As is well known in the art, the ADC encodes an analog input signal into a digital output signal of a predetermined bit length, N. The encoding of the analog input $V_A$, into a digital output signal of N-bits is typically approximated as a binary fraction of a full-scale output voltage, $V_{SS}$. Hence, the output of the converter corresponds to an N-bit digital word D given as:

$$D = V_A/V_{SS} = (B_1/2^1) + (B_2/2^2) + \ldots + (B_N/2^N),$$

where $B_1, B_2, \ldots, B_N$ are the binary bit coefficients having a value of either a one or a zero. In this setting, the binary coefficient B1 represents the most significant bit while $B_N$ represents the least significant bit of the digital word. The binary bit coefficients are obtained from the output of the ADC converter.

Conventional ADCs often use a successive approximation of techniques to convert an analog signal into a digital signal. In successive approximation methods, the analog input voltage is successively approximated one bit at a time to arrive at the output digital voltage signal. For example, for a 10-bit result, ten different approximations take place with one approximation to set each one of the bits.

Typically, conventional ADCs use a fixed number of clock cycles for all of the bits to be set so that the same amount of time is used for each bit approximation. In practice, however, the number of clock cycles needed to set each of the bits is usually different for each of the bits. These ADCs select a period of time for clock cycle based on the worst bit case in the approximation. For example, the most significant bit may require 16 clock cycles to convert. For all subsequent bits, the clock cycles for this worst case bit is used to set each of the bits even though the remaining bits may not require as many clock cycles to convert. This means that for the rest of the bits, substantial amount of time will be wasted. Accordingly, the speed of the ADC in converting an analog signal to a digital data may consume significantly more time than is necessary.

Thus, what is needed is an ADC that can convert individual data bits in clock cycles that are tailored to the timing requirements for each individual data bits to reduce conversion time. What is also needed is an ADC converter that is programmable to the conversion time requirements of different ADC converters bits due to manufacturing process variations.

SUMMARY OF THE INVENTION

Broadly speaking, the present invention fills these needs by providing programmable ADC with bit conversion optimization and method therefor. It should be appreciated that the present invention can be implemented in numerous ways, including as a process, an apparatus, a system, computer readable media, or a device. Several inventive embodiments of the present invention are described below.

In one embodiment, the present invention provides a programmable ADC with bit conversion optimization. The programmable ADC includes an amplifier, a programmable clock generator, a comparator, a successive approximation logic, a digital-to-analog converter, and a voltage converter. The amplifier is arranged to sample and hold an input analog signal to be converted into N digital data bits. The programmable clock generator generates a clock signal for each of the N-bits to trigger setting of one of the N-bit digital data bits such that each of the N bits is set during a time optimized for each bit. The comparator is coupled to receive and compare the input analog signal with a successively approximated analog signal to generate a digital output signal. The successive approximation logic is configured to successively set each of the N-bits in response to the digital output signal and the clock signal to generate a successively approximated N-bit digital data. The digital-to-analog converter converts the successively approximated N-bit digital data into a successively approximated analog current signal. The voltage converter has a resistance value for converting the successively approximated analog current signals into the successively approximated analog voltage signal for input to the comparator. The voltage converter is arranged to optimize a time constant defined by the resistance and an output capacitance of the digital-to-analog converter. Preferably, the voltage converter is a variable or programmable resistor that can be set to a specified resistance value to speed up the digital-to-analog converter.

In another embodiment, the present invention provides a method for converting an analog voltage signal into digital data bits with bit conversion optimization. The method includes: (a) successively generating clock signals for a set of digital data bits, each clock signal being adapted to trigger setting of one of the digital data bits such that each of the bits is set during a time optimized for the bit; (b) comparing an input analog signal and a successively approximated analog voltage signal to generate a digital output signal; (c) successively setting each of the digital data bits in response to the digital output signal and the clock signal to generate a successively approximated digital data bits; (d) converting the successively approximated digital data bits into a successively approximated analog current signal; and (e) converting, by a resistor having a resistance value, the successively approximated analog current signal into the successively approximated analog voltage signal, the resistor being configured to optimize a time constant defined by the resistance and an output capacitance of the digital-to-analog converter.

Advantageously, the present invention thus optimizes conversion time for each individual bits by storing an optimum number of clock cycles for converting each individual bit. By setting each individual data bits one at a time by cycling through the stored optimum clock cycle numbers, the present invention substantially increases the speed of the ADC. In addition, a voltage converter such as a resistor is used to provide optimum time constant RC to further speed up the ADC to generate output digital data bits. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

The present invention provides programmable ADC with bit conversion optimization and method therefor. It will be obvious, however, to one skilled in the art, that the present invention may be practiced without some or all of these specific details. In other instances, well known process operations have not been described in detail in order not to unnecessarily obscure the present invention.

The present invention provides a programmable ADC and method for converting an analog signal into digital data bits using bit optimization. To optimize conversion for individual bits, an optimum number of clock cycles is determined and stored for converting each bit. Then, the digital data bits are set one at a time by cycling through the stored optimum clock cycle numbers during successive bit conversions. By thus optimizing conversion time for each bit, the present invention substantially increases the speed of the ADC. In addition, a voltage converter is used to provide optimum time constant RC to further speed up the ADC to generate and finally output digital data bits.

Figure 1:
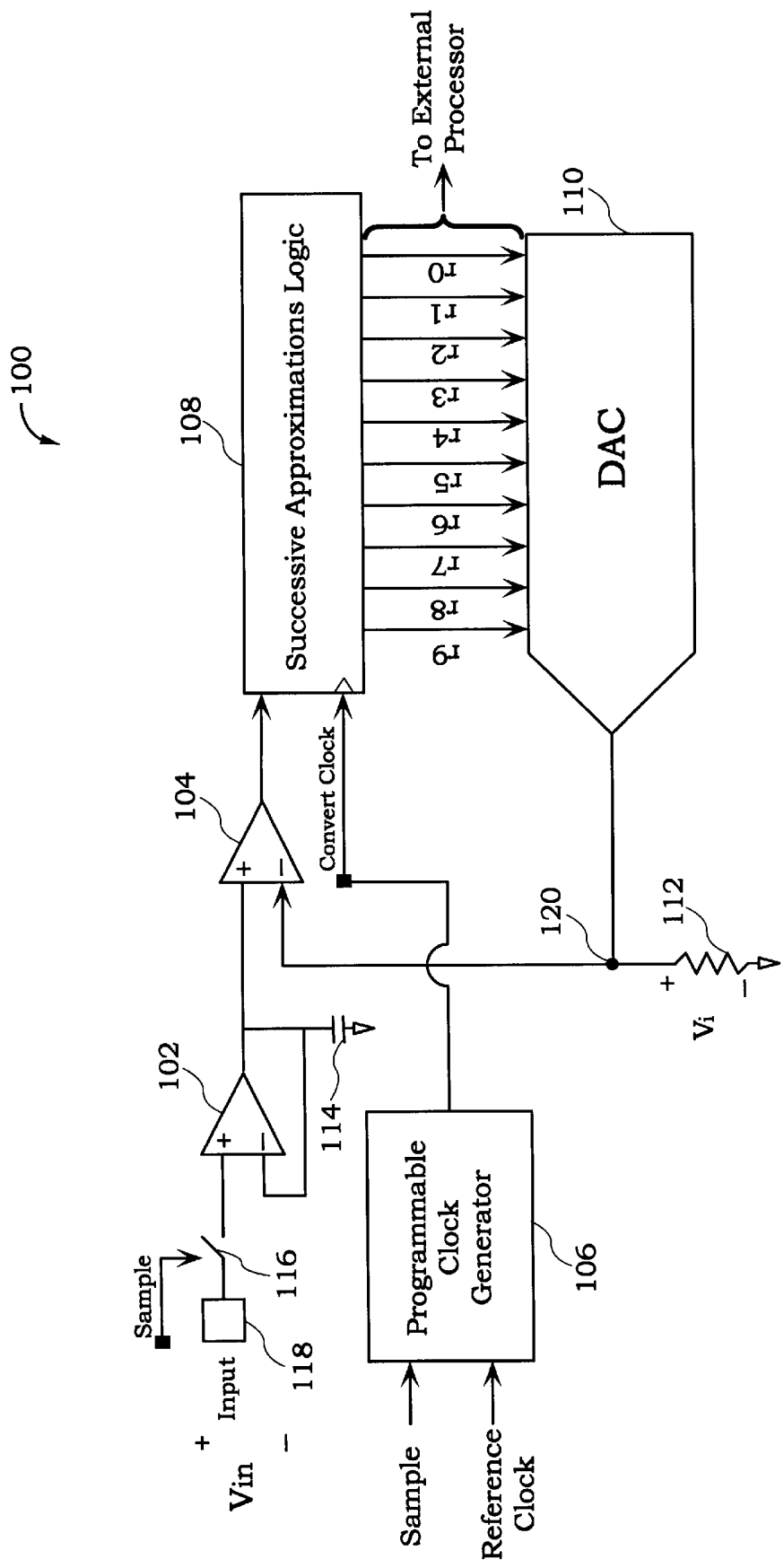
FIG. 1 illustrates an exemplary analog-to-digital converter (ADC) for converting an analog input voltage signal into a 10-bit digital data.

FIG. 1 illustrates an exemplary ADC 100 for converting an analog input voltage signal into a 10-bit digital data. However, it will be appreciated that the ADC 100 may be implemented generically to produce any N-bit digital data from the analog input voltage signal. The ADC 100 includes a sample and hold amplifier 102, a comparator 104, a successive approximations logic 108, a digital-to-analog converter (DAC) 110, a resistor 112, and a capacitor 114. The analog input voltage is received from a pin 118 via a switch 116. The switch 116 operates in response to a sample signal that indicates whether to sample the analog input voltage from the pin 118. Specifically, the switch 116 transmits the analog input voltage to an input port of the sample and hold amplifier 102 when the sample signal is asserted. Then, the sample and hold amplifier 102 holds or stores the received input voltage when the switch 116 becomes open. The other input port of the sample and hold amplifier 102 is coupled to the capacitor 114 and amplifies with unity gain or holds the received input voltage.

The amplified analog input voltage is then provided as an input to the comparator 104. The comparator 104 is also coupled to receive a successively approximated analog voltage from an output node of the DAC 110 and the resistor 112. The comparator 104 compares the analog input voltage and the successively approximated analog voltage to generate a digital output signal. The digital output signal indicates whether the successively approximated analog voltage is greater than or less than the analog input voltage and is provided to the successive approximations logic 108. Initially, the successively approximated analog voltage at node 120 will be zero so that the digital output signal from the comparator will be deasserted (i.e., low) to indicate that the successively approximate analog voltage is less than the analog input voltage.

The programmable clock generator 106 receives the sample signal and a reference clock to generate a convert clock signal, which is provided to the successive approximations logic 108 to control conversion or setting of individual bits as a result of the analog input signal level. As will be shown in more detail below, the programmable clock generator 106 stores the number of reference clock cycles needed to convert or set each data bit to optimize conversion time for each bit. Then, in response to a sample signal, the programmable clock generator 106 generates the convert clock signal for a data bit to be set in the successive approximations logic 108. The convert clock signal triggers the successive approximations logic 108 to convert associated data bit.

In response to the digital output of comparator 104 and the convert clock signal, the successive approximation logic sets the 10 bits starting, preferably, from the most significant bit r9. For example, the most significant bit r9 is set at 1 while the remaining data bits r8 to r0 are set to 0. These ten data bit values of r9 to r0 are provided to the DAC 110, which is preferably a current source DAC, and converts the data bit values into a current signal. In one embodiment, the DAC 110 is an 8-2 DAC that includes an 8-bit DAC and a 2-bit DAC. In another embodiment, the DAC 110 may be a 7-3 DAC having a 7-bit DAC and a 3-bit DAC.

The resistor 112 is coupled to the output of the DAC 110 to convert the current signal from the DAC 110 into the successively approximated analog voltage at node 120 for input to the comparator 104. The performance of the DAC 110 depends substantially on a time constant defined by the resistance value R of the resistor 112 and the output capacitance C of the DAC 110 at the output node 120. Although the current embodiment is illustrated using a resistor, it may also employ any suitable current-to-voltage converter for converting the output signal from the DAC 110 into voltage form.

The resistor 112 is optimized to speed up the DAC 110 in generating the output current signal by providing an optimum time constant RC for the given power dissipation requirements. In one embodiment, the resistor 112 is a programmable or variable resistor that can be adjusted to a desired resistance value such as 4kΩ. A suitable resistance value may selected by stepping through the resistance values, for example, between 100 Ω and 10KΩ in increments of 1KΩ. Then, the resistance value that provides the fastest output for the DAC 110 is selected as the optimum value for the resistor 112 that meet speed and power requirements. After the resistor value for resistor 112 has been optimized, the successive approximations ADC 100 is ready to be used.

The successively approximated analog voltage is then provided as an input to the comparator 104. The comparator 104 then compares the successively approximated analog voltage with the analog input voltage to generate an output signal that indicates whether the successively approximated analog voltage is greater than or less than the analog input voltage. With bit r9 set, the successive approximation logic 108 then sets the next most significant bit r8. As will be discussed in more detail below, the ADC 100 proceeds to set each of the remaining bits from bit r8 though r0 using the successive approximations logic 108 in a similar manner. When all the bits have been set, the successive approximations logic 108 outputs bits r9 through r0 as converted digital data bits for the analog input voltage.

Figure 2:
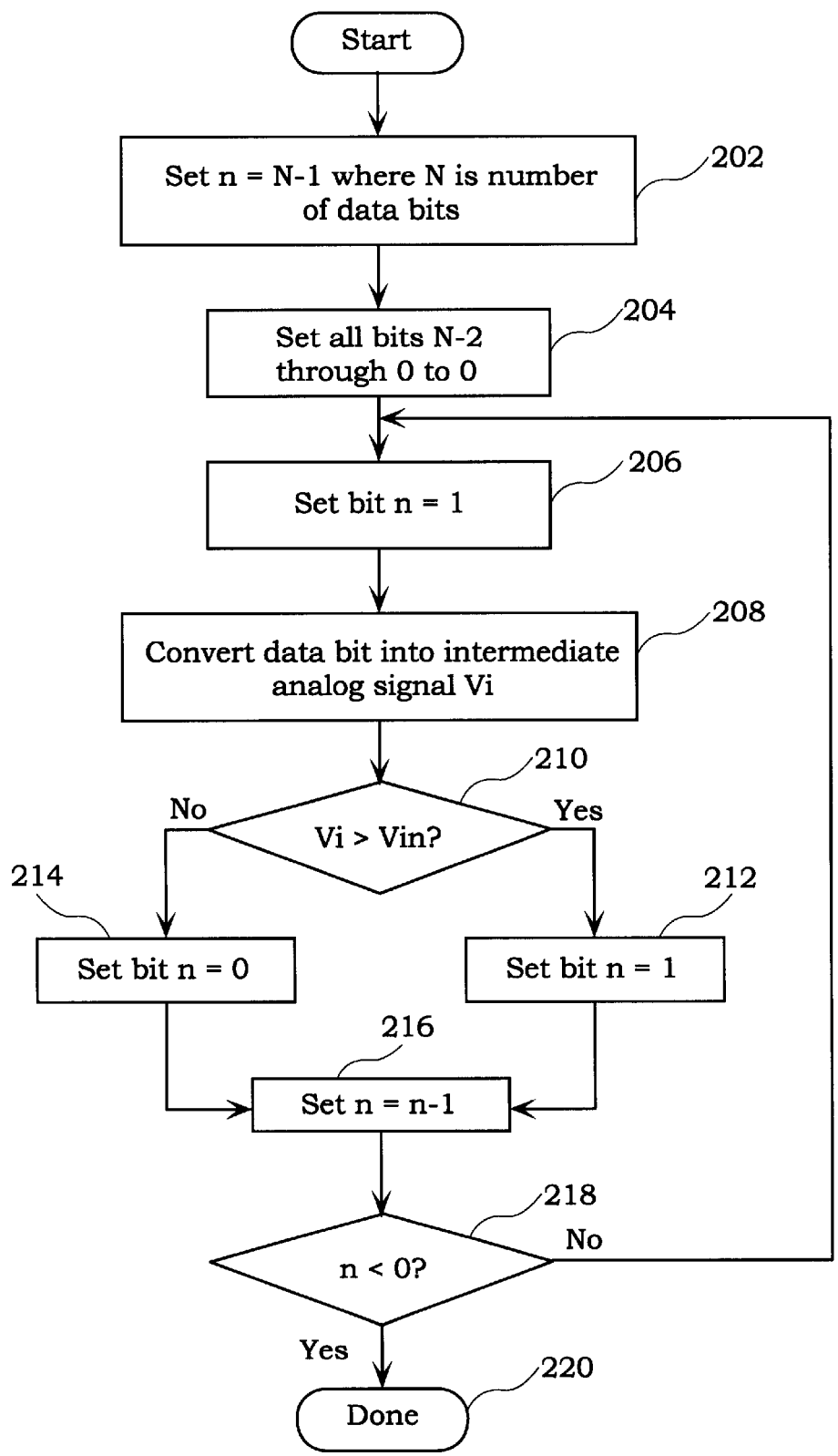
FIG. 2 shows a flowchart of an exemplary method performed by the ADC 100 to convert an analog input voltage Vin into N data bits.

FIG. 2 shows a flowchart of an exemplary method 200 performed by the ADC 100 to convert an analog input voltage Vin into N data bits. In operation 202, n is set to N-1 for setting bit position N-1 in the N data bits. For N=10, for example, n will be set to 9. Then in operation 204, all data bits from N-2 through 0 are initially set to 0. This has the effect of clearing the data bits. Once the data bits have been initialized, the most significant data bit n in the N data bits is set to 1 in operation 206. For a 10-bit output number, for example, n will be equal to 9 so that bit r9 can be set first. The data bits from 0 to n are then converted into an intermediate analog voltage signal Vi, which is a successively approximated analog voltage. For instance, the 10 bits are initially set to "1000000000," which is then converted into the intermediate analog voltage signal Vi.

The intermediate analog voltage signal Vi is then compared with the input voltage Vin in operation 210. If Vi is greater than Vin, then bit n is set to 1 in operation 212. Otherwise, the bit n is set to 0 in operation 214. Then, n is set to n-1 to set the next most significant bit. For the 10-bit example above, n will be set to 8 for setting bit r8. It is then determined in operation 218 whether n is less than 0. If n is not less than 0, then the method proceeds back to operation 206, where the new bit n is set to 1. However, if n is less than 0, this means that all N bits have been set, i.e., converted, and the method terminates in operation 220.

Figure 3:
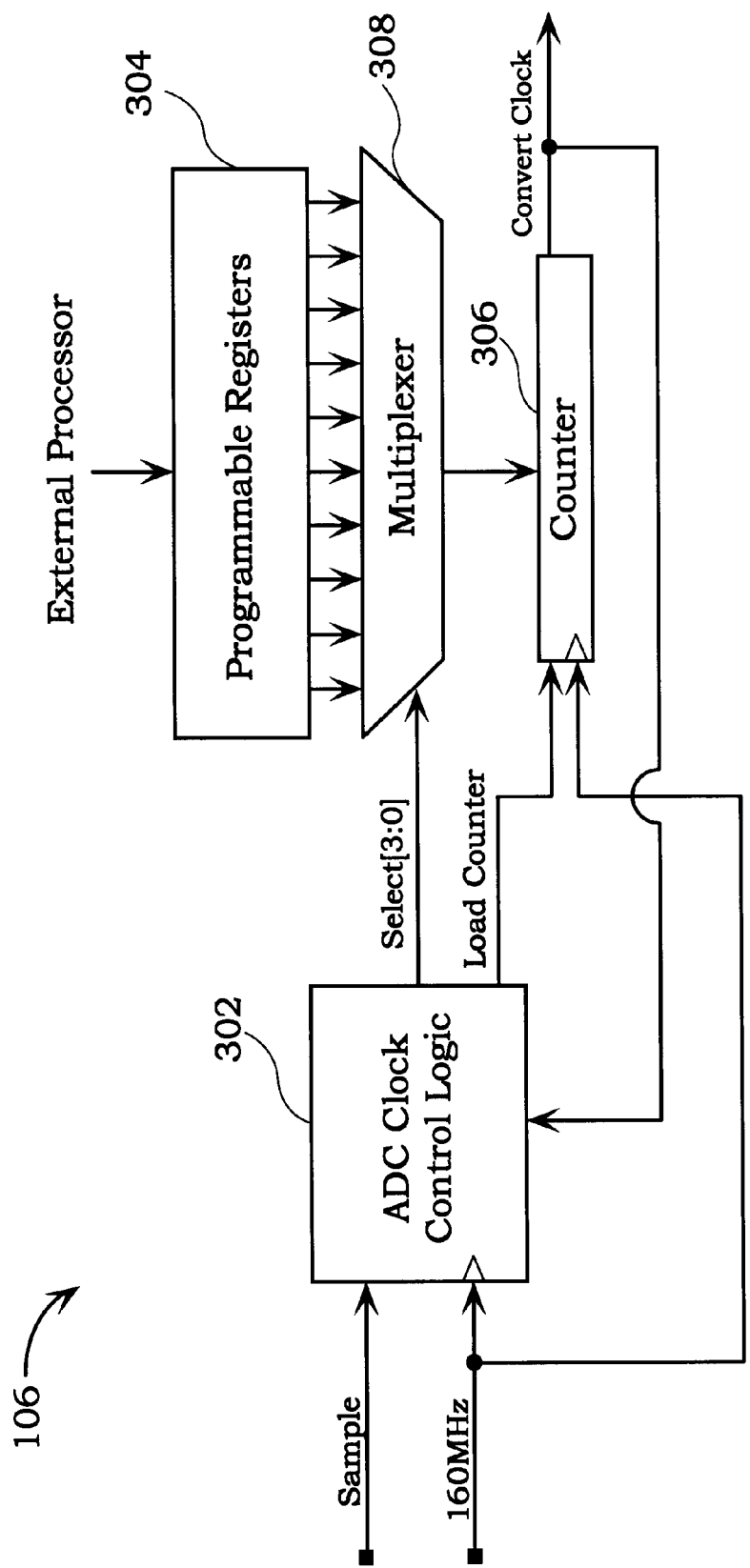
FIG. 3 illustrates a detailed schematic diagram of a programmable clock generator in accordance with one embodiment of the present invention.

FIG. 3 illustrates a more detailed schematic diagram of the programmable clock generator 106 in accordance with one embodiment of the present invention. The programmable clock generator 106 includes an ADC clock control logic 302, a set of programmable registers 304, a counter 306, and a multiplexer 308. The programmable registers 304 store a set of minimum time periods needed to convert each of the N bits. For example, ten registers may be provided to store ten time values for converting the analog signal into 10 data bits. Each register is associated with one of the bits and stores a time value needed to convert the associated bit.

The ADC clock control logic 302 receives the sample signal and a reference clock to sequentially cycle through the registers 304 from the register associated with the most significant bit to the register associated with the least significance. The sample signal triggers the ADC clock control logic 302 to load the time period stored for the most significant bit by issuing select signal to the multiplexer 308 and a load signal to the counter 306. The multiplexer 308 then selects the time value for the most significant bit from one of the registers 304 and routes the selected time value to the counter 306.

The counter 306 loads the selected time value in response to the load signal and starts counting using the reference clock. The counter 306 then generates a convert clock signal when it has counted the time value received from the multiplexer 308. In one embodiment, the counter 306 is configured to generate a carryout signal as the convert clock, which is then fed back to the ADC clock control logic 302 to initiate loading the time value for the next most significant bit. In this manner, the programmable clock generator 106 cycles through the time values stored in the programmable registers 304 to provide optimum conversion time for converting an analog input signal into digital data bits.

Figure 4:
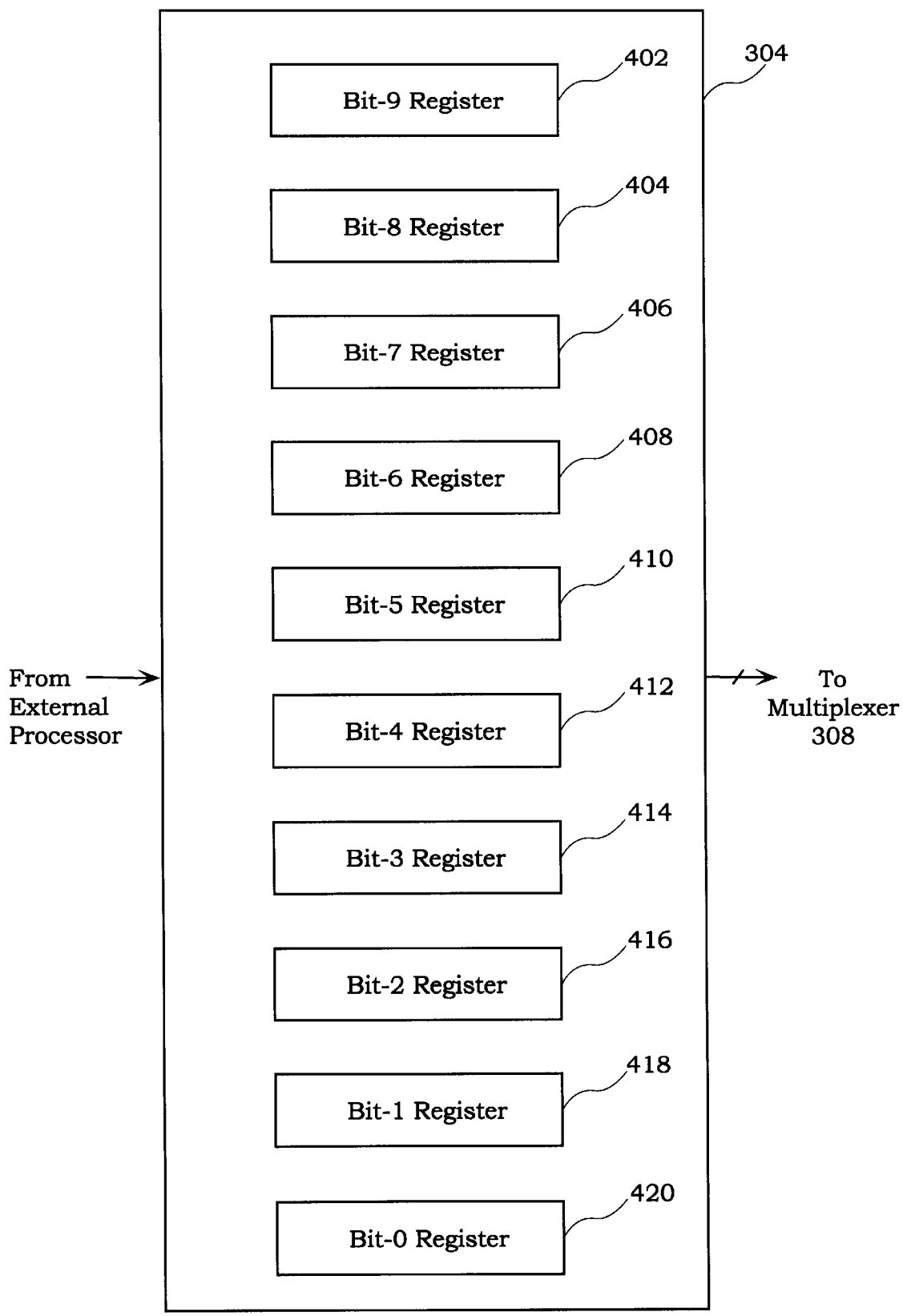
FIG. 4 shows a detailed block diagram of a set of programmable registers for storing time values in accordance with one embodiment of the present invention.

FIG. 4 shows a more detailed block diagram of the programmable registers 304 for storing time values in accordance with one embodiment of the present invention. The programmable registers 304 include a bit-9 register 402, a bit-8 register 404, a bit-7 register 406, a bit-6 register 408, a bit-5 register 410, a bit-4 register 412, a bit-3 register 414, a bit-2 register 416, a bit-1 register 418, and a bit-0 register 420. In this setting, a bit-i register stores a five bit value that is used for controlling the time values for converting ith bit. These registers 402 to 420 are coupled to an external processor (not shown) to receive programmed time values.

By way of example, for a 10-bit data conversion, the select signal of FIG. 3 is a 4-bit signal while the counter 306 is a 5-bit counter. If a reference clock of 160 MHz is used, the convert clock length is programmable from 1 to 32 clock cycles. Each clock cycle is 160 MHz clock is 6.25 nanosecond. An exemplary set of time values that may be stored for converting an analog input signal into a 10-bit data is shown in following Table 1.

TABLE 1

| Programmable Registers | Stored Time Values (Clocks) |
|---|---|
| Bit-9 Register | 16 |
| Bit-8 Register | 10 |
| Bit-7 Register | 8 |
| Bit-6 Register | 8 |
| Bit-5 Register | 6 |
| Bit-4 Register | 6 |
| Bit-3 Register | 5 |
| Bit-2 Register | 5 |
| Bit-1 Register | 4 |
| Bit-0 Register | 4 |

As shown in Table 1, the number of clocks stored in the programmable registers 402 to 420 are tailored to individual bit conversion. As a trend, the more significant bits require generally more time to convert than less significant bits. For example, converting bit 9 requires 16 clocks while converting bit 0 requires 4 clocks. The total number of clocks used in generating 10-bit data is thus 72 clocks. In contrast, conventional method of using a fixed number of clocks based on the worst bit case for each of the bits requires substantially more time. For example, using 16 clocks for each of the bits requires 160 clocks. Hence, the present invention provides significant advantages in conversion time over conventional methods.

Figure 5:
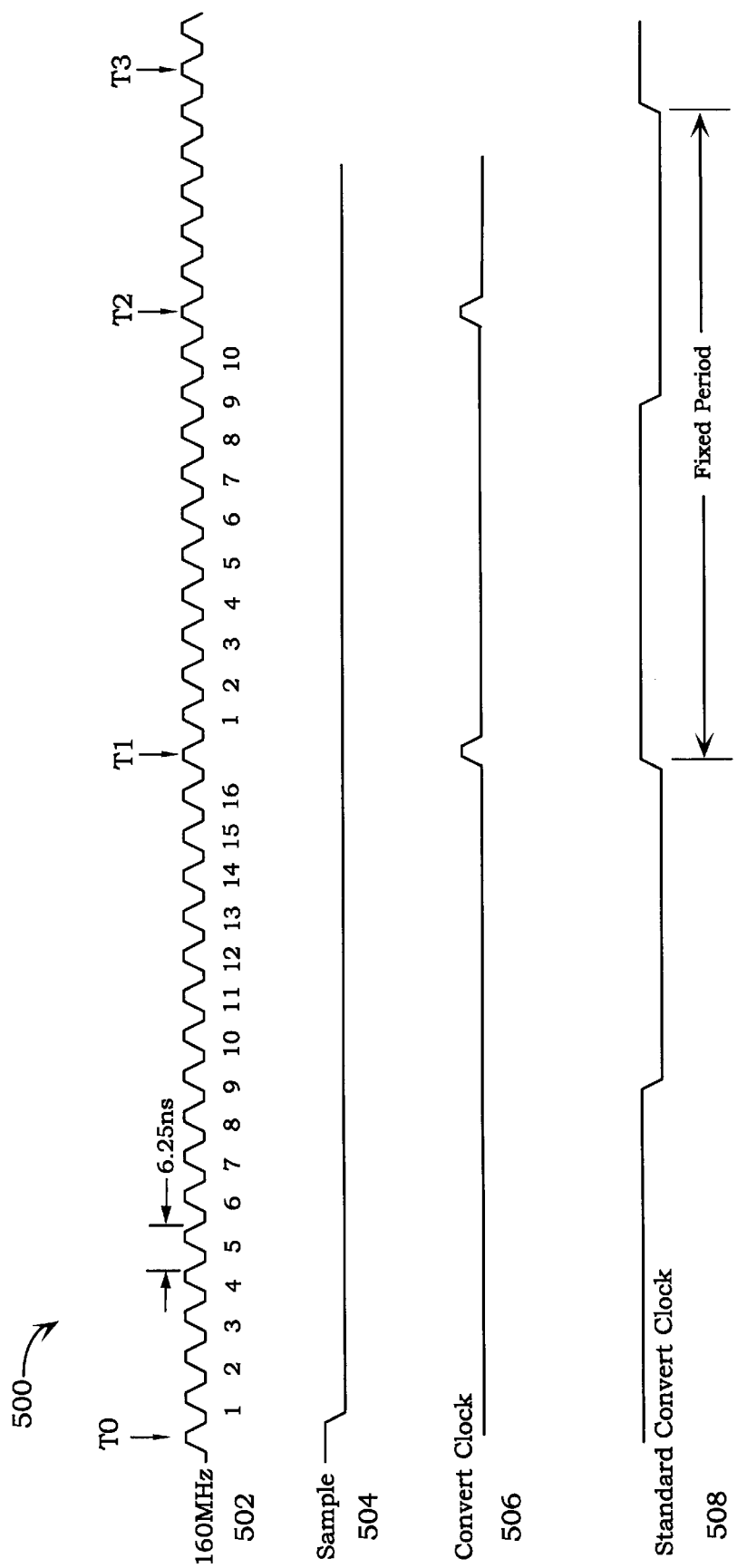
FIG. 5 shows an exemplary timing diagram of a convert clock generated by the programmable clock generator in accordance with one embodiment of the present invention compared to a conventional convert clock.

FIG. 5 shows an exemplary timing diagram 500 of a convert clock 506 generated by the programmable clock generator 106 compared to a conventional convert clock 508 in accordance with one embodiment of the present invention. In this diagram, a clock signal 502 of 160 MHz with a clock cycle of 6.25 nanosecond is used as a reference clock. In response to the reference input clock 502 and a sample signal 504 at time T0, the convert clock signal 506 is generated to convert bit 9 during 16 clock cycles between T0 and T1. Then, the next bit 8 is converted in 10 clock cycles between T1 and T2. The remaining bits will be converted in a similar manner using, for example, the clock cycles shown in Table 1 above.

On the other hand, the conventional convert clock signal 508 uses 16-fixed clock cycles to convert each of the bits. The most significant bit 9 will be converted in 16 clock cycles. However, for the remaining bits, a substantial portion of the fixed clock cycles will not be used. For example, converting bit 8 requires the same 16 clock cycles. Compared to the 10 clock cycles of the convert clock 506, this translates to a slower conversion time by 6 clock cycles.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A programmable analog-to-digital converter with bit conversion optimization, comprising:
    an amplifier for sampling and holding an input analog signal to be converted into N digital data bits;
    a programmable clock generator for generating a clock signal for each of the N-bits to trigger setting of one of the N-bit digital data bits such that each of the N bits is set during a time optimized for each bit;
    a comparator coupled to receive and compare the input analog signal with a successively approximated analog signal to generate a digital output signal;
    a successive approximation logic for successively setting each of the N-bits in response to the digital output signal and the clock signal to generate a successively approximated N-bit digital data;
    a digital-to-analog converter for converting the successively approximated N-bit digital data into a successively approximated analog current signal; and
    a voltage converter having a resistance value for converting the successively approximated analog current signals into the successively approximated analog signal for input to the comparator, the voltage converter being configured to optimize a time constant defined by the resistance and an output capacitance of the digital-to-analog converter.

2. The programmable analog-to-digital converter as recited in claim 1, wherein the programmable clock generator comprises:
    N registers storing conversion time periods that are optimized for converting the N-bit digital data bits, each register storing one conversion time period for converting one of the N digital data bits;
    a counter for generating the clock signal for setting each of the N bits in response to associated conversion time period from one of the N registers;
    an analog-to-digital clock control logic for generating control signals for successively loading the conversion time periods into the counter such that the counter generates the clock signals that are optimized for setting associated bits.

3. The programmable analog-to-digital converter as recited in claim 2, wherein the amplifier is a sample and hold amplifier that samples the input analog signal in response to a sample signal and wherein the amplifier holds the input analog signal when the sample signal is not asserted.

4. The programmable analog-to-digital converter as recited in claim 3, wherein the analog-to-digital clock control logic receives the sample signal and a reference clock signal and wherein the clock signal from the counter triggers the analog-to-digital clock control logic to load a next conversion time period into the counter.

5. The programmable analog-to-digital converter as recited in claim 2, wherein the programmable clock generator further comprises:
    a multiplexer coupled between the N registers and the counter for loading one of the conversion time periods into the counter in response to one of the control signals.

6. The programmable analog-to-digital converter as recited in claim 2, wherein the control signals include:
    a first signal for selecting one of the N registers; and
    a load signal for loading the conversion time period from the selected register into the counter.

7. The programmable analog-to-digital converter as recited in claim 2, wherein the digital output signal from the comparator indicates whether the successively approximated analog signal is higher or lower than the input analog signal.

8. The programmable analog-to-digital converter as recited in claim 2, wherein the programmable clock generator cycles through the N registers for successively setting the N-bit digital data.

9. A programmable analog-to-digital converter with bit conversion optimization, comprising:
    a programmable clock generator for successively generating clock signals for a set of digital data bits, each clock signal being adapted to trigger setting of one of the digital data bits such that each of the bits is set during a time optimized for the bit;
    a comparator coupled to receive and compare an input analog signal and a successively approximated analog voltage signal to generate a digital output signal;
    a successive approximation logic for successively setting each of the digital data bits in response to the digital output signal and the clock signal to generate a successively approximated digital data bits;
    a digital-to-analog converter for converting the successively approximated digital data bits into a successively approximated analog current signal; and
    a resistor having a resistance value for converting the successively approximated analog current signal into the successively approximated analog voltage signal for input to the comparator, the resistor being configured to optimize a time constant defined by the resistance and an output capacitance of the digital-to-analog converter.

10. The programmable analog-to-digital converter as recited in claim 9, further including an amplifier for sampling and holding the input analog signal to be converted into a set of digital data bits for input to the comparator.

11. The programmable analog-to-digital converter as recited in claim 10, wherein the amplifier is a sample and hold amplifier that samples the input analog signal in response to a sample signal and wherein the amplifier holds the input analog signal when the sample signal is not asserted.

12. The programmable analog-to-digital converter as recited in claim 11, wherein the analog-to-digital clock control logic receives the sample signal and a reference clock signal and wherein the clock signal from the counter triggers the analog-to-digital clock control logic to load a next conversion time period into the counter.

13. The programmable analog-to-digital converter as recited in claim 9, wherein the programmable clock generator comprises:
    a set of registers storing a set of conversion time periods that are optimized for setting the digital data bits, each register storing one conversion time period for setting one of the digital data bits;
    a counter for generating the clock signal for setting each of the digital data bits in response to associated conversion time period from one of the registers;
    an analog-to-digital clock control logic for generating control signals for successively loading the conversion time periods into the counter such that the counter generates the clock signals that are optimized for setting associated bits.

14. The programmable analog-to-digital converter as recited in claim 11, wherein the programmable clock generator further comprises:
   a multiplexer coupled between the set of registers and the counter for loading one of the conversion time periods into the counter in response to one of the control signals.

15. The programmable analog-to-digital converter as recited in claim 11, wherein the control signals include:
   a first signal for selecting one of the set of registers; and
   a load signal for loading the conversion time period from the selected register into the counter.

16. The programmable analog-to-digital converter as recited in claim 11, wherein the digital output signal from the comparator indicates whether the successively approximated analog signal is higher or lower than the input analog signal.

17. The programmable analog-to-digital converter as recited in claim 11, wherein the programmable clock generator cycles through the registers for successively setting starting values for the counter.

18. A method for converting an analog voltage signal into digital data bits with bit conversion optimization, comprising:
   successively generating a clock signal with changing duration based on a set of counter starting values, each clock signal duration being adapted to trigger setting of one of the digital data bits such that each of the bits is set during a time optimized for the each bit;
   comparing an input analog signal and a successively approximated analog voltage signal to generate a digital output signal;
   successively setting each of the digital data bits in response to the digital output signal and the clock signal to generate a successively approximated digital data bits;
   converting the successively approximated digital data bits into a successively approximated analog current signal; and
   converting, by a resistor having a resistance value, the successively approximated analog current signal into the successively approximated analog voltage signal, the resistor being configured to optimize a time constant defined by the resistance and an output capacitance of the digital-to-analog converter.

19. The method as recited in claim 18, wherein the operation of successively generating the clock signals comprises:
   storing a set of conversion time periods that are optimized for setting each of the digital data bits, one conversion time period being stored for setting one of the digital data bits;
   generating the clock signal for converting each of the digital data bits in response to the associated conversion time period;
   generating control signals for successively loading the conversion time periods into the counter so as to generate the clock signals that are optimized for setting associated bits.

20. The method as recited in claim 19, wherein the operation of successively generating the clock signals further comprises:
   loading one of the conversion time periods into the counter in response to one of the control signals.

21. The method as recited in claim 19, wherein the conversion time periods are successively cycled through to successively convert the digital data bits.

22. The method as recited in claim 18, further comprising:
   sampling and holding the input analog signal for conversion into a set of digital data bits.

* * * * *